(12) United States Patent
Kuroyanagi et al.

(10) Patent No.: US 10,504,836 B2
(45) Date of Patent: Dec. 10, 2019

(54) FAN-OUT SEMICONDUCTOR PACKAGE

(71) Applicant: SAMSUNG ELECTRONICS CO., LTD., Suwon-si (KR)

(72) Inventors: Akihisa Kuroyanagi, Suwon-Si (KR); Jun Woo Myung, Suwon-Si (KR); Eun Sil Kim, Suwon-Si (KR); Yeong A Kim, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/053,193

(22) Filed: Aug. 2, 2018

(65) Prior Publication Data

US 2019/0252311 A1 Aug. 15, 2019

(30) Foreign Application Priority Data

Feb. 9, 2018 (KR) .......................... 10-2018-0016157

(51) Int. Cl.
*H01L 23/31* (2006.01)
*H01L 23/522* (2006.01)
(Continued)

(52) U.S. Cl.
CPC ........ *H01L 23/5226* (2013.01); *H01L 23/528* (2013.01); *H01L 24/09* (2013.01);
(Continued)

(58) Field of Classification Search
CPC ............ H01L 23/3114; H01L 23/3135; H01L 23/3142
See application file for complete search history.

(56) References Cited

U.S. PATENT DOCUMENTS 8,642,897 B2 * 2/2014 Sakai ................... H01L 24/24
174/260
9,691,708 B1 6/2017 Huang et al.
(Continued)

FOREIGN PATENT DOCUMENTS

JP 2002-246722 A 8/2002
JP 2006-269594 A 10/2006
(Continued)

OTHER PUBLICATIONS

Office Action issued in corresponding Taiwanese Application No. 107127323, dated Feb. 26, 2019.
(Continued)

*Primary Examiner* — Jae Lee
(74) *Attorney, Agent, or Firm* — Sughrue Mion, PLLC

(57) ABSTRACT

A fan-out semiconductor package includes: a frame including insulating layers, wiring layers, and connection via layers, and having a recess portion and a stopper layer disposed on a bottom surface of the recess portion; a semiconductor chip disposed in the recess portion; a resin layer disposed on an active surface of the semiconductor chip; an encapsulant covering at least portions of side surfaces of the semiconductor chip and the resin layer and filling at least portions of the recess portion; a first redistribution layer disposed on the resin layer and the encapsulant; first redistribution vias penetrating through the resin layer to fill via holes in the resin layer exposing at least portions of the connection pads and electrically connecting the connection pads and the first redistribution layer to each other; and a connection member disposed on the resin layer and the encapsulant and including one or more second redistribution layers.

20 Claims, 14 Drawing Sheets

(51) Int. Cl.
*H01L 23/00* (2006.01)
*H01L 23/528* (2006.01)

(52) U.S. Cl.
CPC .... *H01L 24/32* (2013.01); *H01L 2224/02379* (2013.01); *H01L 2224/0401* (2013.01)

(56) References Cited

U.S. PATENT DOCUMENTS

| | | | |
|---|---|---|---|
| 10,043,758 B1* | 8/2018 | Lee | H01L 23/3128 |
| 2012/0129299 A1* | 5/2012 | Lin | H01L 21/4878 438/118 |
| 2014/0070396 A1 | 3/2014 | Kyozuka et al. | |
| 2014/0183721 A1 | 7/2014 | Chen et al. | |
| 2017/0256478 A1* | 9/2017 | Sakamoto | H01L 24/76 |
| 2017/0309571 A1 | 10/2017 | Yi et al. | |
| 2017/0365572 A1 | 12/2017 | Lee et al. | |
| 2018/0005955 A1* | 1/2018 | Hsieh | H01L 23/544 |
| 2018/0108639 A1* | 4/2018 | Kang | H01L 21/02063 |

FOREIGN PATENT DOCUMENTS

| | | | |
|---|---|---|---|
| JP | 2012-084891 A | 4/2012 | |
| JP | 2014-056925 A | 3/2014 | |
| KR | 10-2015-0024944 A | 3/2015 | |
| KR | 10-2017-0071826 A | 6/2017 | |
| TW | 201804577 A | 2/2018 | |

OTHER PUBLICATIONS

Communication dated Mar. 18, 2019, issued by the Korean Intellectual Property Office in counterpart Korean Application No. 10-2018-0016157.

* cited by examiner

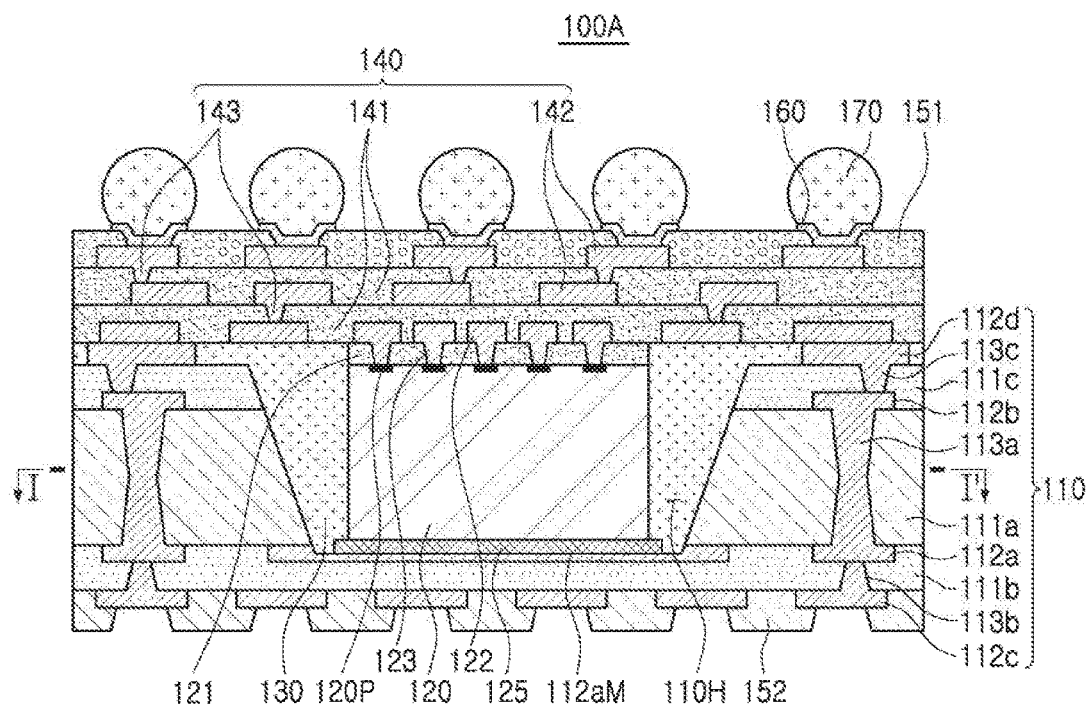
FIG. 9
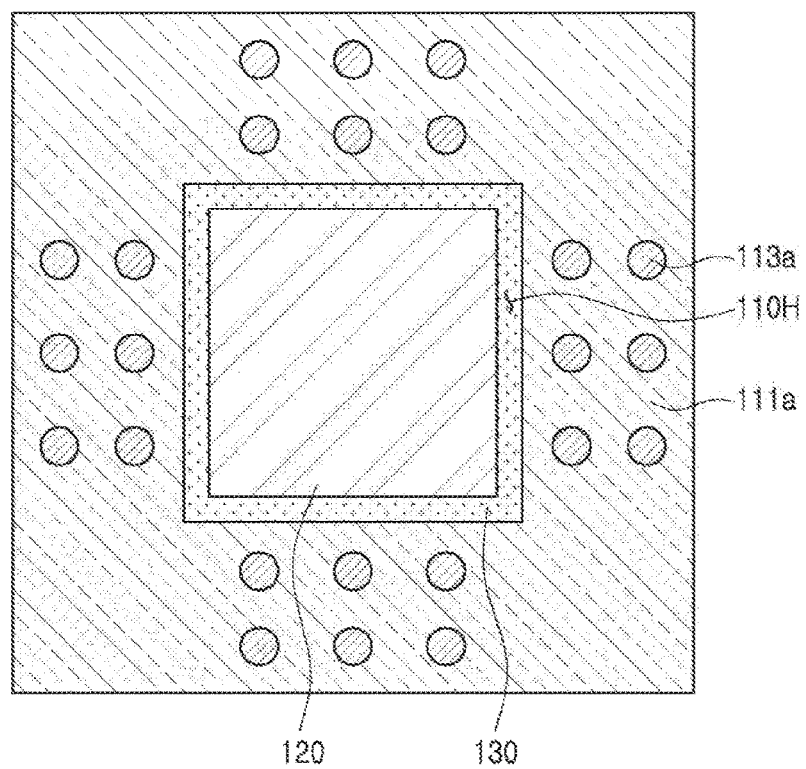
I-I'  FIG. 10

FAN-OUT SEMICONDUCTOR PACKAGE

CROSS-REFERENCE TO RELATED APPLICATION(S)

This application claims benefit of priority to Korean Patent Application No. 10-2018-0016157 filed on Feb. 9, 2018 in the Korean Intellectual Property Office, the disclosure of which is incorporated herein by reference in its entirety.

TECHNICAL FIELD

The present disclosure relates to a semiconductor package, and more particularly, to a fan-out semiconductor package in which electrical connection structures may extend outwardly of a region in which a semiconductor chip is disposed.

BACKGROUND

A significant recent trend in the development of technology related to semiconductor chips has been reductions in the size of semiconductor chips. Therefore, in the field of package technology, in accordance with a rapid increase in demand for small-sized semiconductor chips, or the like, the implementation of a semiconductor package, having a compact size while including a plurality of pins, has been demanded.

One type of semiconductor package technology suggested to satisfy the technical demand, described above, is a fan-out semiconductor package. Such a fan-out package has a compact size and may allow a plurality of pins to be implemented by redistributing connection terminals outwardly of a region in which a semiconductor chip is disposed.

SUMMARY

An aspect of the present disclosure may provide a fan-out semiconductor package in which excellent electrical characteristics may be implemented by reducing a wiring path and a cost may be reduced.

According to an aspect of the present disclosure, a fan-out semiconductor package may be provided, in which a frame having a recess portion and a stopper layer disposed on a bottom surface of the recess portion is introduced, a semiconductor chip is disposed in the recess portion, and a resin layer is formed on an active surface of the semiconductor chip in advance to secure a wiring path by forming a redistribution layer through plating, or the like, without using expensive copper pillars.

According to an aspect of the present disclosure, a fan-out semiconductor package may include: a frame including a plurality of insulating layers, a plurality of wiring layers disposed on the plurality of insulating layers, and a plurality of connection via layers penetrating through the plurality of insulating layers and electrically connecting the plurality of wiring layers to each other, and having a recess portion and a stopper layer disposed on a bottom surface of the recess portion; a semiconductor chip including a body having an active surface having connection pads disposed thereon and an inactive surface opposing the active surface and a passivation layer disposed on the active surface and having openings exposing at least portions of the connection pads, and disposed in the recess portion so that the inactive surface is connected to the stopper layer; a resin layer disposed on the active surface of the semiconductor chip; an encapsulant covering at least portions of side surfaces of each of the semiconductor chip and the resin layer and filling at least portions of the recess portion; a first redistribution layer disposed on the resin layer and the encapsulant; first redistribution vias penetrating through the resin layer to fill via holes in the resin layer exposing at least portions of the connection pads and electrically connecting the connection pads and the first redistribution layer to each other; and a connection member disposed on the resin layer and the encapsulant and including one or more second redistribution layers electrically connected to the first redistribution layer. The connection pads may be electrically connected to the plurality of wiring layers.

BRIEF DESCRIPTION OF DRAWINGS

The above and other aspects, features, and advantages of the present disclosure will be more clearly understood from the following detailed description taken in conjunction with the accompanying drawings, in which:

FIG. 9 is a schematic cross-sectional view illustrating an example of a fan-out semiconductor package;

FIG. 10 is a schematic plan view taken along line I-I' of the fan-out semiconductor package of FIG. 9;

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a downward direction in relation to cross sections of the drawings for convenience, while an upper side, an upper portion, an upper surface, and the like, are used to refer to an opposite direction to the downward direction. However, these directions are defined for convenience of explanation, and the claims are not particularly limited by the directions defined as described above.

The meaning of a "connection" of a component to another component in the description conceptually includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
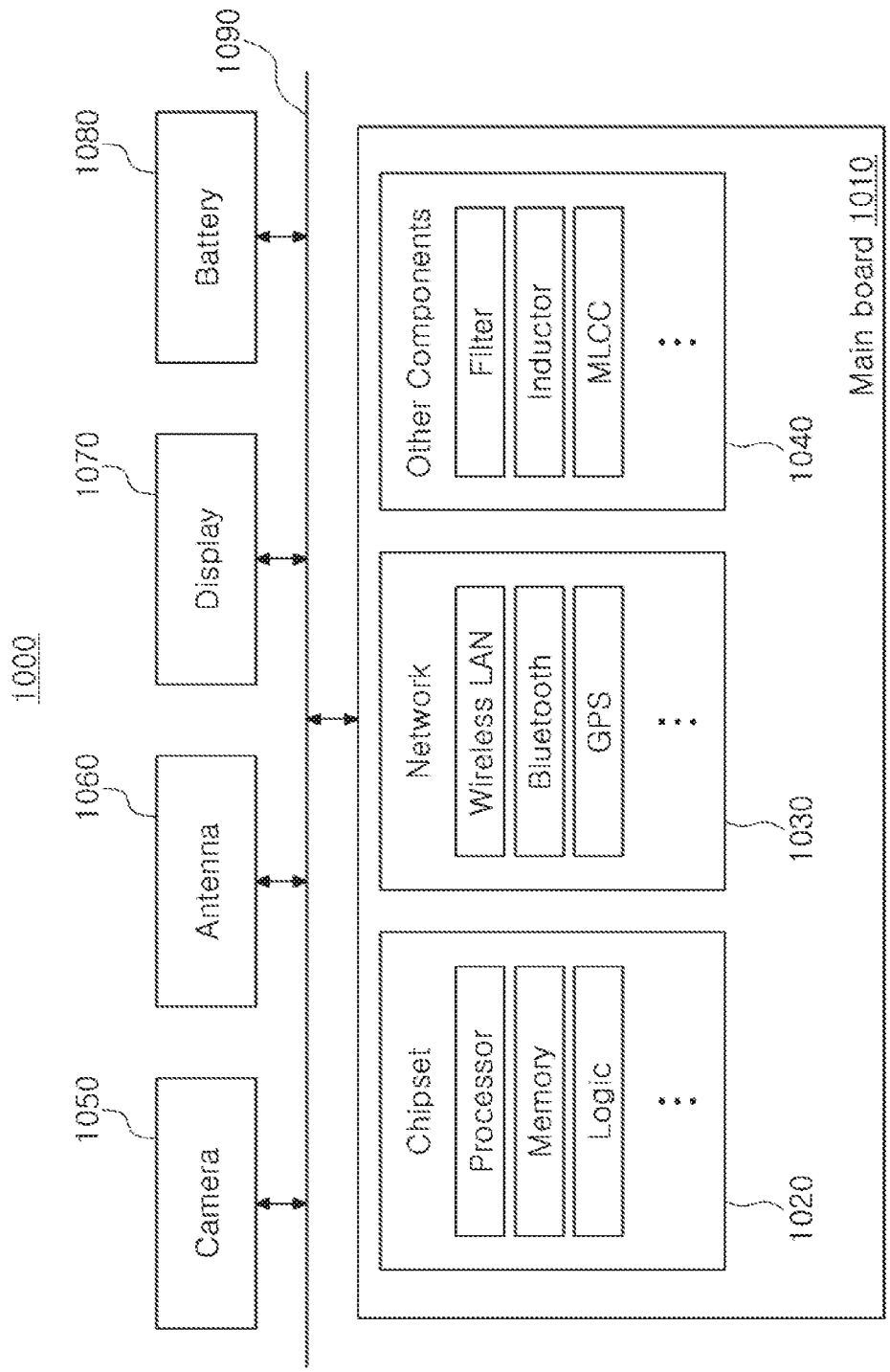
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
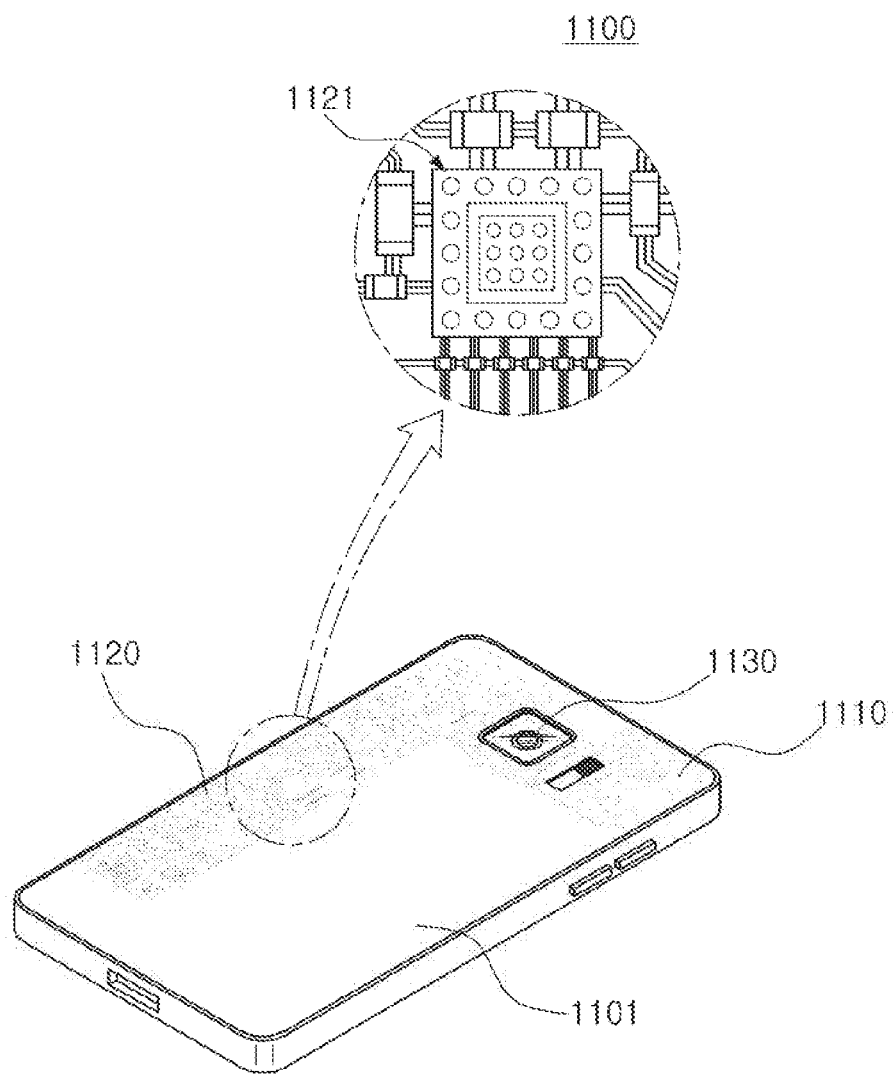
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
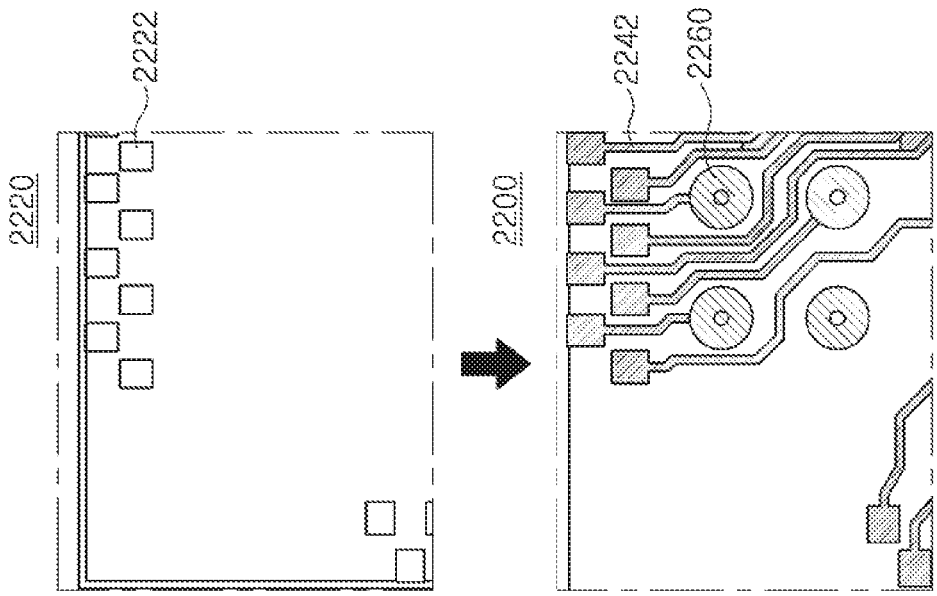
FIGS. 3A and 3B are schematic cross-sectional views illustrating states of a fan-in semiconductor package before and after being packaged.
Figure 3A:
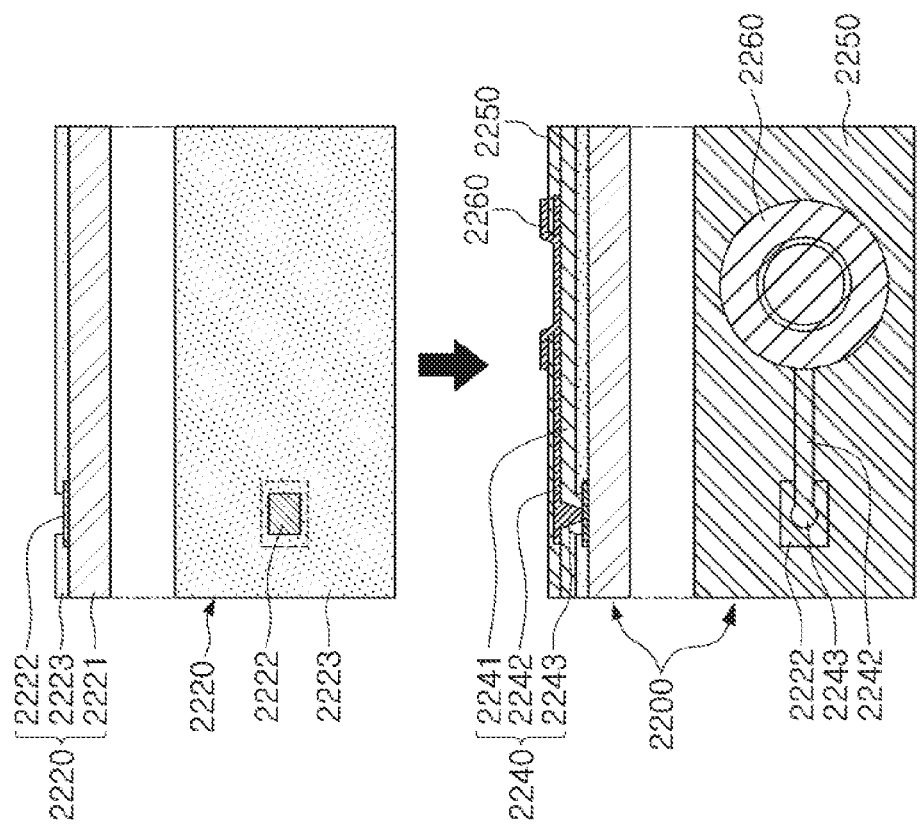

FIGS. 3A and 3B are schematic cross-sectional views illustrating states of a fan-in semiconductor package before and after being packaged.

Figure 4:
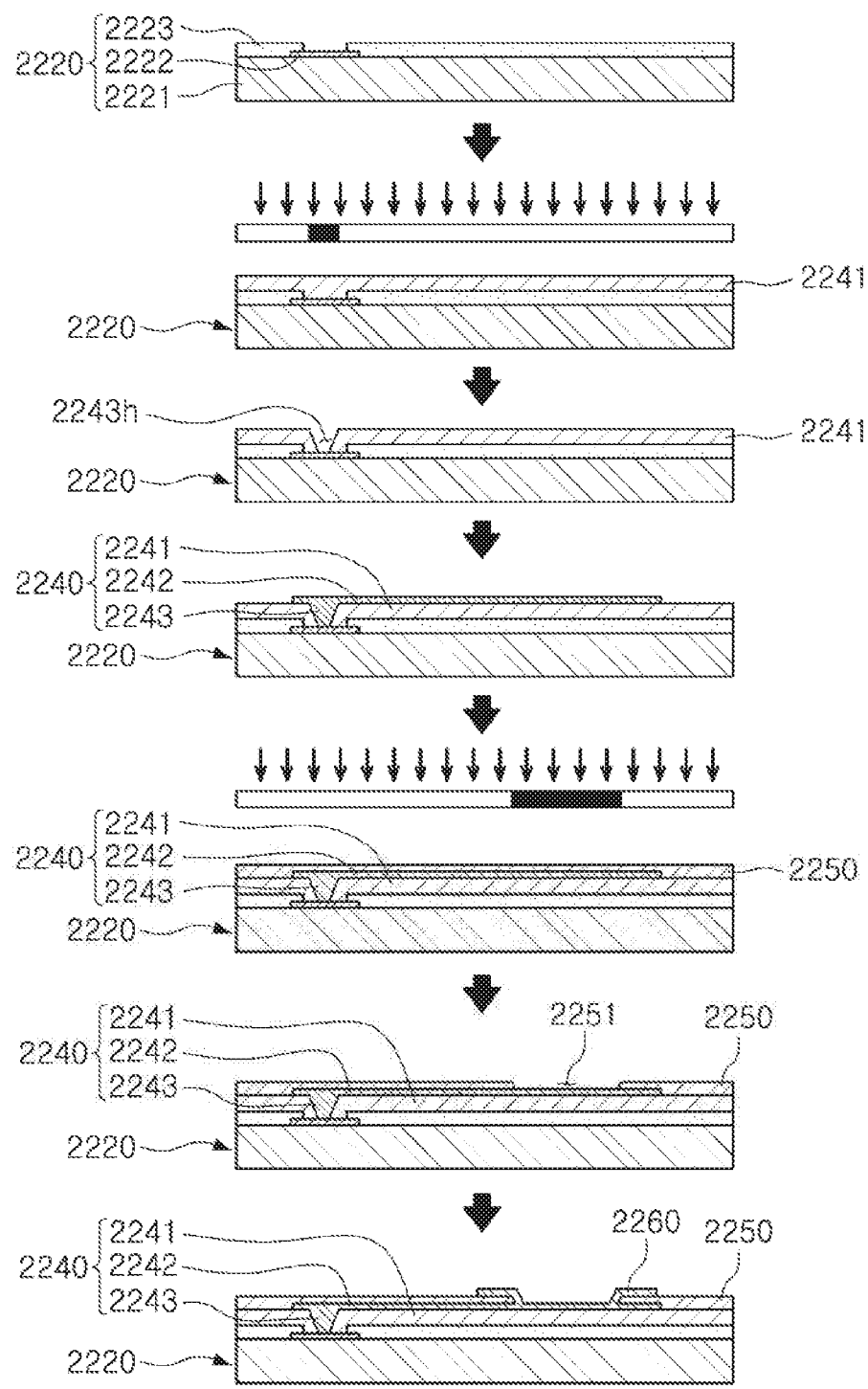
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
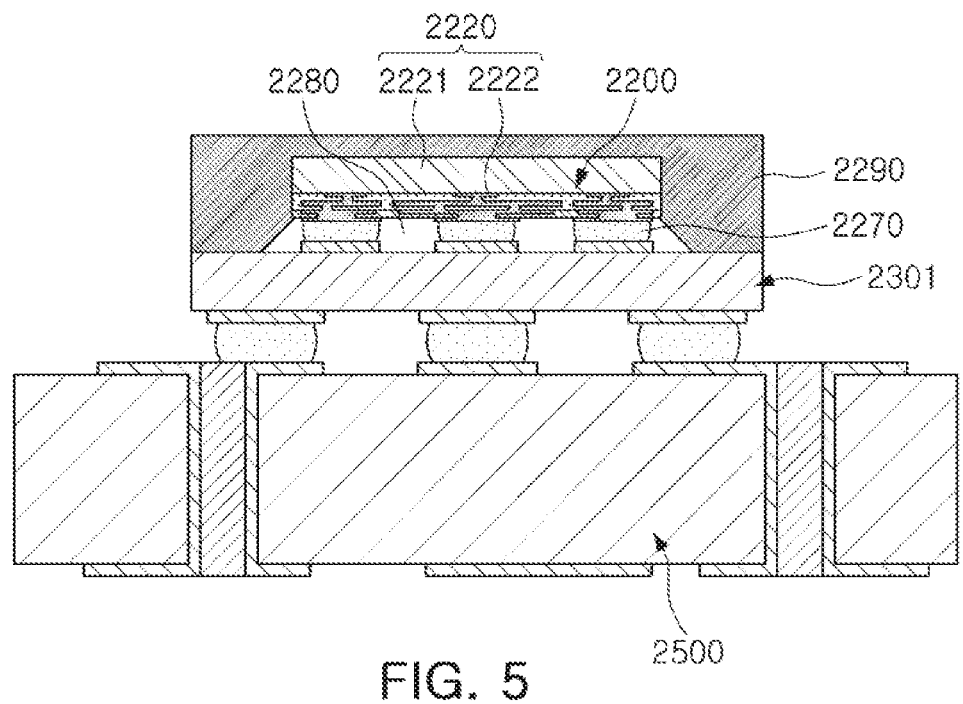
FIG. 5 is a schematic cross-sectional view illustrating a case in which a fan-in semiconductor package is mounted on a ball grid array (BGA) substrate and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
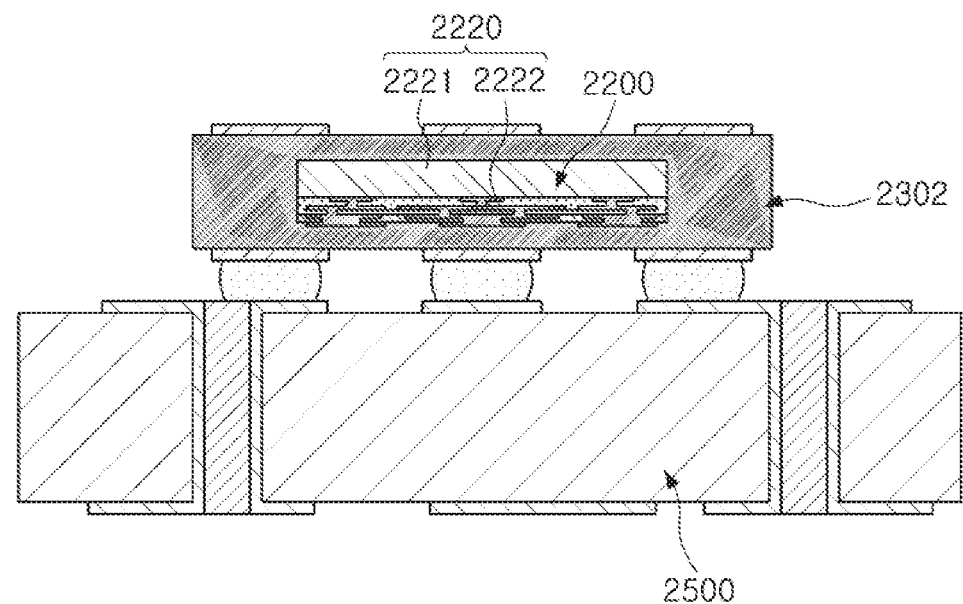
FIG. 6 is a schematic cross-sectional view illustrating a case in which a fan-in semiconductor package is embedded in a BGA substrate and is ultimately mounted on a mainboard of an electronic device.

FIG. 6 is a schematic cross-sectional view illustrating a case in which a fan-in semiconductor package is embedded in a BGA substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
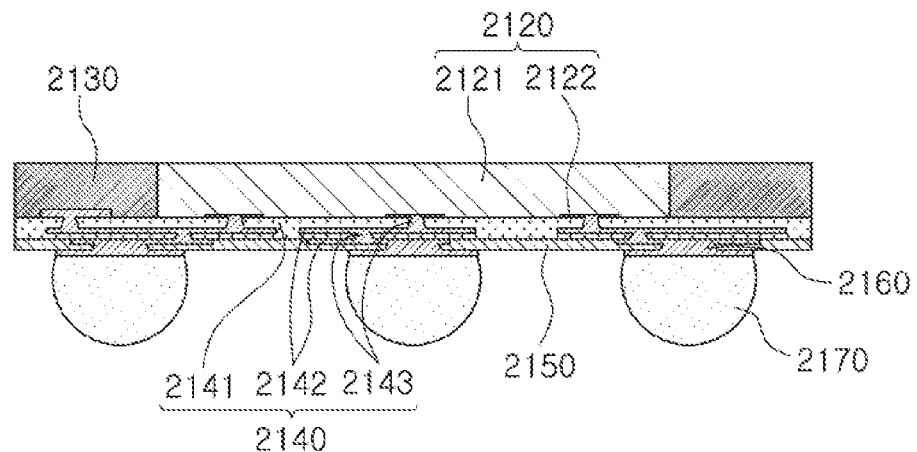
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
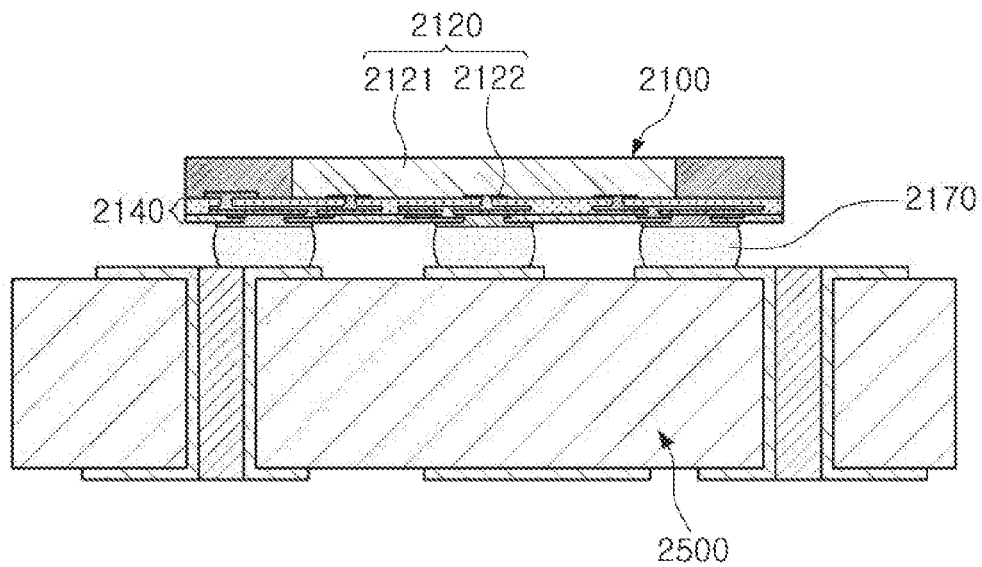
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

A fan-out semiconductor package in which a core member having a blind cavity by a barrier layer is introduced will hereinafter be described with reference to the drawings.

FIG. 9 is a schematic cross-sectional view illustrating an example of a fan-out semiconductor package.

FIG. 10 is a schematic plan view taken along line I-I' of the fan-out semiconductor package of FIG. 9.

Referring to FIGS. 9 and 10, a fan-out semiconductor package 100A according to an exemplary embodiment in the present disclosure may include a frame 110 including a plurality of insulating layers 111a, 111b, and 111c, a plurality of wiring layers 112a, 112b, 112c, and 112d, and a plurality of connection via layers 113a, 113b, and 113c, and having a recess portion 110H having a stopper layer 112aM disposed on a bottom surface thereof, a semiconductor chip 120 having an active surface having connection pads 120P disposed thereon and an inactive surface opposing the active surface and disposed in the recess portion 110H so that the inactive surface is connected to the stopper layer 112aM, a resin layer 121 disposed on the active surface of the semiconductor chip 120, an encapsulant 130 covering at least portions of side surfaces of each of the semiconductor chip 120 and the resin layer 121 and filling at least portions of the recess portion 110H, a first redistribution layer 122 disposed on the resin layer 121 and the encapsulant 130, first redistribution vias 123 penetrating through the resin layer 121 and electrically connecting the connection pads 120P and the first redistribution layer 122 to each other, and a connection member 140 disposed on the resin layer 121 and the encapsulant 130 and including one or more dielectric layers 141, one or more second redistribution layers 142, and one layer or more second redistribution vias 143. An upper surface of the resin layer 121 may be disposed to be coplanar with an upper surface of the encapsulant 130, which may be performed by a grinding process, or the like, as described below. Similarly, an upper surface of a fourth wiring layer 112d disposed at the uppermost portion of the frame 110 may be disposed to be coplanar with the upper surface of the resin layer 121 and the upper surface of the encapsulant 130. Meanwhile, an expression "coplanar" herein refers that surfaces are disposed on substantially the same level as a result of a grinding process, or the like, as well as that surfaces are disposed on completely the same level.

Meanwhile, in order to introduce a frame having a recess portion having a blind form, dispose and then encapsulate a semiconductor chip in the recess portion, and form a connection member on the semiconductor chip, bumps such as copper pillars need to be formed on connection pads of the semiconductor chip in advance. In this case, a grinding process is required in order to form a flat surface for forming the connection member. The reason is that a height step between the bumps needs to be made to be constant. However, grinded surfaces of the bumps have small areas, and a burr phenomenon in which a material constituting the bumps, such as copper (Cu), or the like, is spread may thus occur in the grinding process, resulting in an unexpected electrical short-circuit. In addition, when wirings are connected to each other through the bumps, a wiring path is relatively increased, such that there is a limitation in optimizing electrical characteristics. In addition, a process of forming the bumps such as the copper pillars on the semiconductor chip in advance requires a high cost, and a cost problem may thus occur.

On the other hand, in the fan-out semiconductor package 100A according to the exemplary embodiment, as seen from processes to be described below, the semiconductor chip 120 may be disposed in the recess portion 110H having the blind form in a state in which the resin layer 121 is formed on the active surface of the semiconductor chip 120 in advance, and a height step between the resin layer 121 and the encapsulant 130 may be removed by a grinding process. Then, the first redistribution layer 122 and the first redistribution vias 123 may be formed by a plating process to promote electrical connection between the connection pads 120P of the semiconductor chip 120 and the fourth wiring layer 112d of the frame 110. Therefore, separate bumps may not be required. Resultantly, occurrence of a side effect such as a copper burr may be significantly decreased, electrical characteristics may be relatively improved by a significant reduction in a wiring path, and a cost may be reduced.

The respective components included in the fan-out semiconductor package 100A according to the exemplary embodiment will hereinafter be described in more detail.

The frame 110 may improve rigidity of the fan-out semiconductor package 100A depending on certain materials, and serve to secure uniformity of a thickness of the encapsulant 130. In addition, the frame 110 may include the wiring layers 112a, 112b, 112c, and 112d, and the connection via layers 113a, 113b, and 113c, and thus serve as a vertical electrical connection member. In addition, the frame 110 may include a third wiring layer 112c disposed on a level below the inactive surface of the semiconductor chip 120, and thus provide a backside wiring layer for the semiconductor chip 120 without performing a process of forming a separate backside wiring layer. The frame 110 may have the recess portion 110H formed using the stopper layer 112aM as a stopper and having the blind form, and the inactive surface of the semiconductor chip 120 may be attached to the stopper layer 112aM through any known adhesive member 125 such as a die attach film (DAF), or the like. The recess portion 110H may be formed by a sandblast process as described below. In this case, the recess portion 110H may have a tapered shape. That is, walls of the recess portion 110H may have a predetermined gradient with respect to the stopper layer 112aM. In this case, a process of aligning the semiconductor chip 120 may be easier, and a yield of the semiconductor chip 120 may thus be improved.

The frame 110 may include a core insulating layer 111a, first and second wiring layers 112a and 112b disposed on upper and lower surfaces of the core insulating layer 111a, respectively, a first build-up insulating layer 111b disposed on the lower surface of the core insulating layer 111a and covering the first wiring layer 112a, the third wiring layer 112c disposed on the first build-up insulating layer 111b, a second build-up insulating layer 111c disposed on the upper surface of the core insulating layer 111a and covering the second wiring layer 112b, and the fourth wiring layer 112d disposed on the second build-up insulating layer 111c. In addition, the frame 110 may include first connection via layers 113a penetrating through the core insulating layer 111a and electrically connecting the first and second wiring layers 112a and 112b to each other, second connection via layers 113b penetrating through the first build-up insulating layer 111b and electrically connecting the first and third wiring layers 112a and 112c to each other, and third connection via layers 113c penetrating through the second build-up insulating layer 111c and electrically connecting the second and fourth wiring layers 112b and 112d to each other. The first to fourth wiring layers 112a, 112b, 112c, and 112d may be electrically connected to each other, and may be electrically connected to connection pads 120P of the semiconductor chip 120. The recess portion 110H may penetrate through the core insulating layer 111a and the second build-up insulating layer 111c, but may not penetrate through the first build-up insulating layer 111b. The stopper layer 112aM may be disposed on the lower surface of the core insulating layer 111a and be covered with the first build-up insulating layer 111b.

The stopper layer 112aM may be a metal layer including a metal such as copper (Cu), or the like. Alternatively, the stopper layer 112aM may include a material of which an etch rate for a sandblast process is lower than that of the metal. For example, a dry film photoresist may be used as the stopper layer. When the stopper layer 112aM is the metal layer, the stopper layer 112aM itself may be used as a ground. In this case, the stopper layer 112aM may be electrically connected to a ground of at least one of the wiring layers 112a, 112b, 112c, and 112d. A lower surface of the stopper layer 112aM may be covered with the first build-up insulating layer 111b, and at least portions of an upper surface of the stopper layer 112aM may be exposed by the recess portion 110H. A thickness of a region of the stopper layer 112aM exposed from the core insulating layer 111a by the recess portion 110H may be smaller than that of an edge region of the stopper layer 112aM that is not exposed from the core insulating layer 111a by the recess portion 110H. The reason is that portions of the exposed region may also be removed in a sandblast process. The stopper layer 112aM may have a planar area greater than that of the inactive surface of the semiconductor chip 120. The bottom surface of the recess portion 110H may have a planar area greater than that of the inactive surface of the semiconductor chip 120.

A material of each of the insulating layers 111a, 111b, and 111c may be an insulating material. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. When a material having high rigidity, such as prepreg including a glass fiber, or the like, is used as the material of each of the insulating layers 111a, 111b, and 111c, the frame 110 may be utilized as a support member for controlling warpage of the fan-out semiconductor package 100A.

The core insulating layer 111a may have a thickness greater than those of the first build-up insulating layer 111b and the second build-up insulating layer 111c. The core insulating layer 111a may be basically relatively thick in order to maintain rigidity, and the first build-up insulating layer 111b and the second build-up insulating layer 111c may be introduced in order to form a larger number of wiring layers 112c and 112d. The core insulating layer 111a may include an insulating material different from those of the first build-up insulating layer 111b and the second build-up insulating layer 111c. For example, the core insulating layer 111a may be, for example, prepreg in which an insulating resin is impregnated together with an inorganic filler in a glass fiber, and the first build-up insulating layer 111b and the second build-up insulating layer 111c may be an ABF or a PID film including an inorganic filler and an insulating resin. However, the materials of the core insulating layer 111a and the first and second build-up insulating layers 111b and 111c are not limited thereto. Similarly, the first connection via layer 113a penetrating through the core insulating layer 111a may have a diameter greater than those of the second and third connection via layers 113b and 113c respectively penetrating through the first and second build-up insulating layers 111b and 111c.

The respective wiring layers 112a, 112b, 112c, and 112d may redistribute the connection pads 120P of the semiconductor chip 120 together with the first and second redistribution layers 122 and 142. A material of each of the wiring layers 112a, 112b, 112c, and 112d may be a conductive material such as copper (Cu), aluminum (Al), silver (Ag), tin (Sn), gold (Au), nickel (Ni), lead (Pb), titanium (Ti), or alloys thereof. The wiring layers 112a, 112b, 112c, and 112d may perform various functions depending on designs of corresponding layers. For example, the wiring layers 112a, 112b, 112c, and 112d may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a, 112b, 112c, and 112d may include various pad patterns, and the like.

Thicknesses of the respective wiring layers 112a, 112b, 112c, and 112d may be greater than those of the respective second redistribution layers 142 of the connection member 140. Since the frame 110 may have a thickness equal to or greater than that of the semiconductor chip 120, the wiring layers 112a, 112b, 112c, and 112d may also be formed to have large sizes. On the other hand, the second redistribution layers 142 of the connection member 140 may be formed to have relatively smaller sizes for thinness.

The respective connection via layers 113a, 113b, and 113c may electrically connect the wiring layers 112a, 112b, 112c, and 112d formed on different layers to each other, resulting in an electrical path in the frame 110. A material of each of the connection via layers 113a, 113b, and 113c may be a conductive material. Each of the connection via layers 113a, 113b, and 113c may be completely filled with the conductive material, or the conductive material may also be formed along a wall of each of via holes. The first connection via layer 113a may have a cylindrical shape or a hourglass shape, and the second and third connection via layers 113b and 113c may have tapered shapes. In this case, the second and third connection via layers 113b and 113c may have tapered shapes of which directions are opposite to each other with respect to the core insulating layer 111a.

The semiconductor chip 120 may be an integrated circuit (IC) provided in an amount of several hundred to several million or more elements integrated in a single chip. The semiconductor chip 120 may be, for example, a processor chip (more specifically, an application processor (AP)) such as a central processor (for example, a CPU), a graphic processor (for example, a GPU), a field programmable gate array (FPGA), a digital signal processor, a cryptographic processor, a microprocessor, a microcontroller, or the like, but is not limited thereto. In addition, the semiconductor chip 120 may be a memory such as a volatile memory (for example, a DRAM), a non-volatile memory (for example, a ROM), a flash memory, or the like, or a logic such as an analog-to-digital converter, an application-specific IC (ASIC), or the like.

The semiconductor chip 120 may be formed on the basis of an active wafer. In this case, referring to FIG. 19, the semiconductor chip 120 may include a body 120B, a passivation layer 120D, and connection pads 120P. A base material of the body 120B of the semiconductor chip 120 may be silicon (Si), germanium (Ge), gallium arsenide (GaAs), or the like. Various circuits may be formed on the body 120B. The connection pads 120P disposed on an active surface of the body 120B may electrically connect the semiconductor chip 120 to other components. A material of each of the connection pads 120P may be a conductive material such as aluminum (Al), or the like. A passivation layer 120D such as an oxide layer, a nitride layer, or the like, exposing the connection pads 120P may be formed on the active surface of the body 120B, and may be a double layer of an oxide layer and a nitride layer. The passivation layer 120D may have openings exposing at least portions of the connection pads 120P, and the first redistribution vias 123 may be connected to the connection pads 120P through the openings of the passivation layer 120D. An insulating layer, and the like, may also be further disposed in required positions. The semiconductor chip 120 may be a bare die. Only the body and the connection pads are simply illustrated in the drawings except for FIG. 19, but a form of the semiconductor chip 120 illustrated in FIG. 19 may be applied to fan-out semiconductor packages 100B, 100C, and 100D according to other exemplary embodiments to be described below as well as the fan-out semiconductor package 100A according to the exemplary embodiment.

Figure 19:
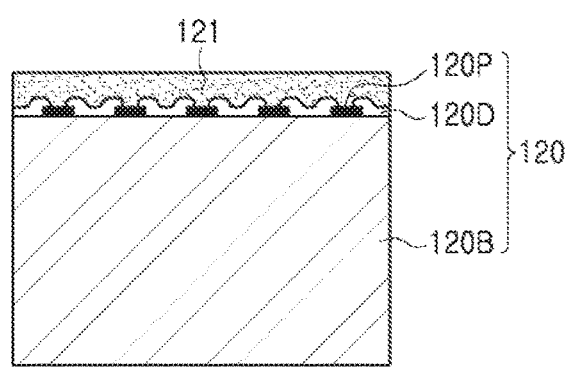
FIG. 19 is a schematic cross-sectional view illustrating an example of a semiconductor chip on which a resin layer is formed.

The resin layer 121 may be disposed on the active surface of the semiconductor chip 120, that is, the active surface of the body 120B in FIG. 19, and may primarily serve as an insulating layer for introducing wirings. The resin layer 121 may be an insulating layer including an organic material, more specifically, an insulating layer including a PID. When the resin layer 121 includes the PID, the first redistribution vias 123 formed in the resin layer 121 may be formed at a finer pitch. The upper surface of the resin layer 121 may be disposed to be coplanar with the upper surface of the encapsulant 130 by a grinding process, or the like, to be described below. Therefore, the first redistribution layer 122 may be easily formed on the upper surface of the resin layer 121 and the upper surface of the encapsulant 130.

The first redistribution layer 122 may primarily redistribute the connection pads 120P of the semiconductor chip 120. In addition, the first redistribution layer 122 may electrically connect the connection pads 120P of the semiconductor chip 120 to the fourth wiring layer 112d of the frame 110. According to the exemplary embodiment, the upper surface of the fourth wiring layer 112d may also be disposed to be coplanar with the upper surface of the encapsulant 130 by a grinding process, or the like. Therefore, at least portions of the first redistribution layer 122 may be in physical contact with at least portions of the fourth wiring layer 112d. A material of the first redistribution layer 122 may be a conductive material such as copper (Cu), aluminum (Al), silver (Ag), tin (Sn), gold (Au), nickel (Ni), lead (Pb), titanium (Ti), or alloys thereof. The first redistribution layer 122 may perform various functions depending on a design. For example, the first redistribution layer 122 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first redistribution layer 122 may include various pad patterns, and the like.

The first redistribution vias 123 may electrically connect the first redistribution layer 122 and the connection pads 120P to each other. The first redistribution vias 123 may be formed by filling via holes, for example, photo via holes formed in the resin layer 121 by plating. Each of the first redistribution vias 123 may include a conductive material such as copper (Cu), aluminum (Al), silver (Ag), tin (Sn), gold (Au), nickel (Ni), lead (Pb), titanium (Ti), or alloys thereof. Each of the first redistribution vias 123 may be completely filled with the conductive material, or the conductive material may also be formed along a wall of each of via holes. Each of the first redistribution vias 123 may have a tapered shape.

The encapsulant 130 may encapsulate the semiconductor chip 120, the resin layer 121, and the like. An encapsulation form of the encapsulant 130 is not particularly limited, but may be a form in which the encapsulant 130 surrounds at least portions of the frame 110, the semiconductor chip 120, and the like. For example, the encapsulant 130 may cover at least portions of the frame 110, and fill spaces between the walls of the recess portion 110H and side surfaces of the semiconductor chip 120. The encapsulant 130 may fill the recess portion 110H to thus serve as an adhesive and reduce buckling of the semiconductor chip 120 depending on certain materials.

A material of the encapsulant 130 is not particularly limited. For example, an insulating material may be used as the material of the encapsulant 130. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a photoimagable encapsulant (PIE) resin may also be used.

The connection member 140 may substantially redistribute the connection pads 120P of the semiconductor chip 120. Several tens to several millions of connection pads 120P having various functions may be redistributed by the connection member 140, and may be physically or electrically externally connected through electrical connection structures 170 depending on the functions.

The connection member 140 may include one or more dielectric layers 141, one or more second redistribution layers 142, and one layer or more second redistribution vias 143. The dielectric layers 141 may be disposed on the resin layer 121 and the encapsulant 130 to cover the first redistribution layer 122. The second redistribution layers 142 may be disposed on the dielectric layers 141, respectively, and the second redistribution vias 143 may electrically connect the first redistribution layer 122 and the second redistribution layers 142 to each other and may also electrically connect the second redistribution layers 142 disposed on different layers to each other. The numbers of dielectric layers 141, second redistribution layers 142, and layers of the second redistribution vias 143 of the connection member 140 may be more than or less than those illustrated in the drawings depending on a design of a product.

A material of each of the dielectric layers 141 may be an insulating material. In this case, a photosensitive insulating material such as a PID resin may also be used as the insulating material. That is, each of the dielectric layers 141 may be a photosensitive insulating layer. When the dielectric layer 141 has photosensitive properties, the dielectric layer 141 may be formed to have a smaller thickness, and a fine pitch of the second redistribution via 143 may be achieved more easily. Each of the dielectric layers 141 may be a photosensitive insulating layer including an insulating resin and an inorganic filler. When the dielectric layers 141 are multiple layers, materials of the dielectric layers 141 may be the same as each other, and may also be different from each other, if necessary. When the dielectric layers 141 are the multiple layers, the dielectric layers 141 may be integrated with each other depending on a process, such that a boundary therebetween may also not be apparent.

The second redistribution layers 142 may serve to substantially redistribute the connection pads 120P. A material of each of the second redistribution layers 142 may be a conductive material such as copper (Cu), aluminum (Al), silver (Ag), tin (Sn), gold (Au), nickel (Ni), lead (Pb), titanium (Ti), or alloys thereof. The second redistribution layers 142 may perform various functions depending on designs of corresponding layers. For example, the second redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the second redistribution layers 142 may include various pad patterns, and the like.

The second redistribution vias 143 may electrically connect the first redistribution layer 122, the second redistribution layers 142, and the like, formed on different layers to each other, resulting in an electrical path in the fan-out semiconductor package 100A. A material of each of the second redistribution vias 143 may be a conductive material such as copper (Cu), aluminum (Al), silver (Ag), tin (Sn), gold (Au), nickel (Ni), lead (Pb), titanium (Ti), or alloys thereof. Each of the second redistribution vias 143 may be completely filled with the conductive material, or the conductive material may also be formed along a wall of each of via holes. In addition, each of the second redistribution vias 143 may have a tapered shape, or the like.

The fan-out semiconductor package 100A according to the exemplary embodiment may further include a first passivation layer 151, a second passivation layer 152, under-bump metal layers 160, electrical connection structures 170, and the like, if necessary.

The first passivation layer 151 may protect the connection member 140 from external physical or chemical damage. The first passivation layer 151 may have openings exposing at least portions of the uppermost second redistribution layer 142 of the connection member 140. The number of openings formed in the first passivation layer 151 may be several tens to several millions. A material of the first passivation layer 151 is not particularly limited. For example, an insulating material may be used as the material of the first passivation layer 151. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

The second passivation layer 152 may protect the frame 110 from external physical or chemical damage. The second passivation layer 152 may have openings exposing at least portions of the third wiring layer 112*c* of the frame 110. The number of openings formed in the second passivation layer 152 may be several tens to several millions. A material of the second passivation layer 152 is not particularly limited. For example, an insulating material may be used as the material of the second passivation layer 152. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

The underbump metal layers 160 may improve connection reliability of the electrical connection structures 170 to improve board level reliability of the fan-out semiconductor package 100A. The underbump metal layers 160 may be connected to the uppermost second redistribution layer 142 of the connection member 140 exposed through the openings of the first passivation layer 151. The underbump metal layers 160 may be formed in the openings of the first passivation layer 151 by any known metallization method using any known conductive material such as a metal, but are not limited thereto.

The electrical connection structures 170 may physically or electrically externally connect the fan-out semiconductor package 100A. For example, the fan-out semiconductor package 100A may be mounted on the mainboard of the electronic device through the electrical connection structures 170. Each of the electrical connection structures 170 may be formed of a conductive material, for example, a solder, or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 120P, or may be provided in an amount of several tens to several thousands or more or several tens to several thousands or less. When the electrical connection structures 170 are solder balls, the electrical connection structures 170 may cover side surfaces of the underbump metal layers 160 extending onto one surface of the first passivation layer 151, and connection reliability may be more excellent.

At least one of the electrical connection structures 170 may be disposed in a fan-out region. The fan-out region refers to a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Meanwhile, although not illustrated in the drawings, a metal thin film may be formed on the walls of the recess portion 110H, if necessary, in order to dissipate heat or block electromagnetic waves. In addition, a plurality of semiconductor chips 120 performing functions that are the same as or different from each other may be disposed in the recess portion 110H, if necessary. In addition, a separate passive component such as an inductor, a capacitor, or the like, may be disposed in the recess portion 110H, if necessary. In addition, passive components, for example, surface mounting technology (SMT) components including an inductor, a capacitor, or the like, may be disposed on surfaces of the first and second passivation layers 151 and 152, if necessary.

FIGS. 11 through 15 are schematic views illustrating processes of manufacturing the fan-out semiconductor package of FIG. 9.

Figure 11:
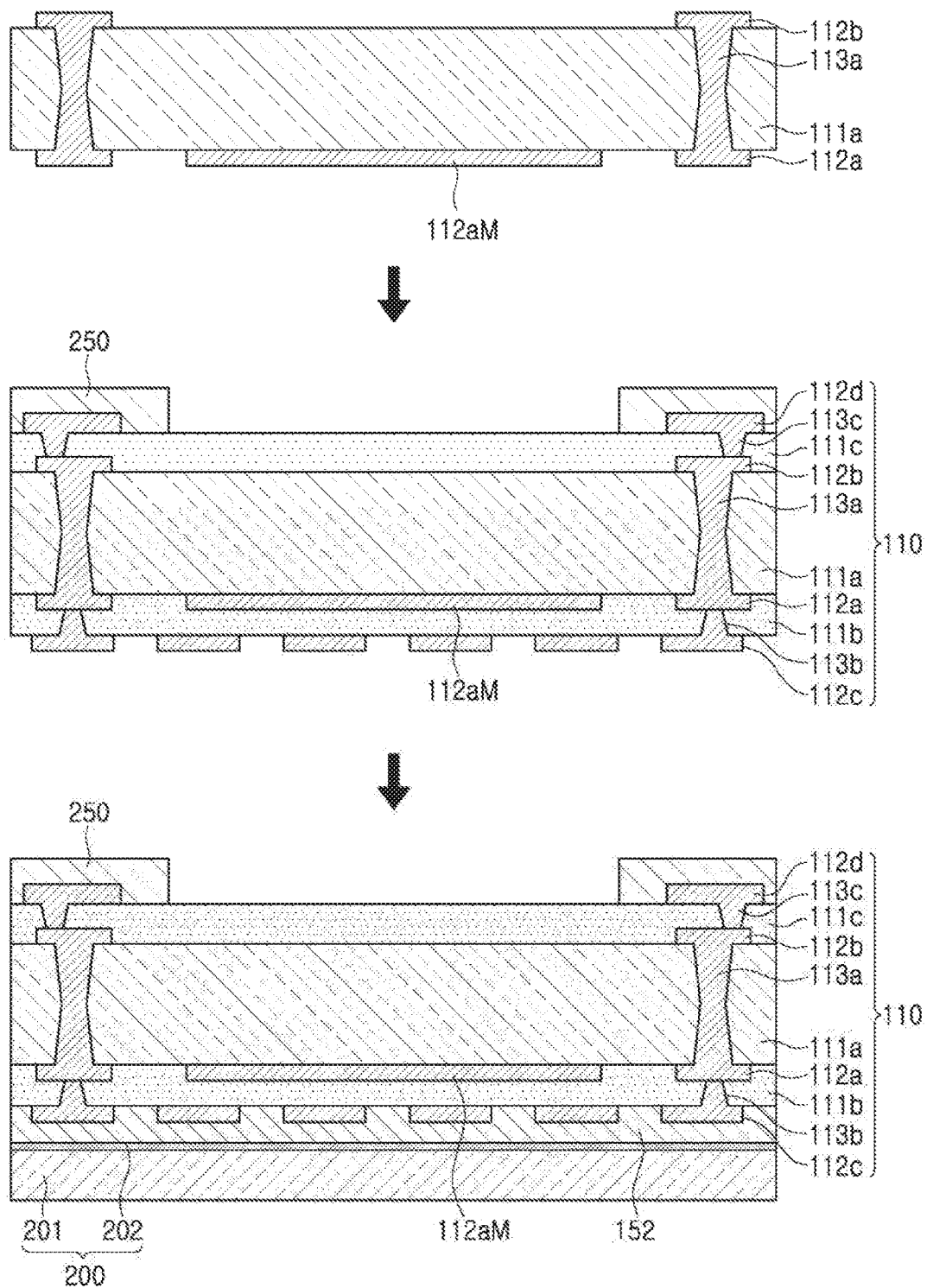
FIGS. 11 through 15 are schematic views illustrating processes of manufacturing the fan-out semiconductor package of FIG. 9.

First, referring to FIG. 11, the core insulating layer 111a may be prepared using a copper clad laminate (CCL), or the like, and the first and second wiring layers 112a and 112b, the stopper layer 112aM, and the first connection via layers 113a may be formed on and in the core insulating layer 111a by any known plating process. Via holes for the first connection via layers 113a may be formed using mechanical drilling, laser drilling, or the like. Then, the first and second build-up insulating layers 111b and 111c may be formed on opposite surfaces of the core insulating layer 111a, respectively. The first and second build-up insulating layers 111b and 111c may be formed by laminating and then hardening an ABF, or the like. Then, the third and fourth wiring layers 112c and 112d and the second and third connection via layers 113b and 113c may be formed on and in the first and second build-up insulating layers 111b and 111c, respectively, by any known plating process. Via holes for the second and third connection via layers 113b and 113c may also be formed using mechanical drilling, laser drilling, or the like. The second passivation layer 152 may be attached to a first surface of the frame 110 prepared by a series of processes, and a carrier film 200 such as a DCF, including an insulating layer 201 and a metal layer 202 may be attached to the second passivation layer 152. The second passivation layer 152 may be introduced using a GCP material. In addition, a dry film 250 such as a dry film photoresist (DFR) may be attached to a lower surface of the frame 110.

Figure 12:
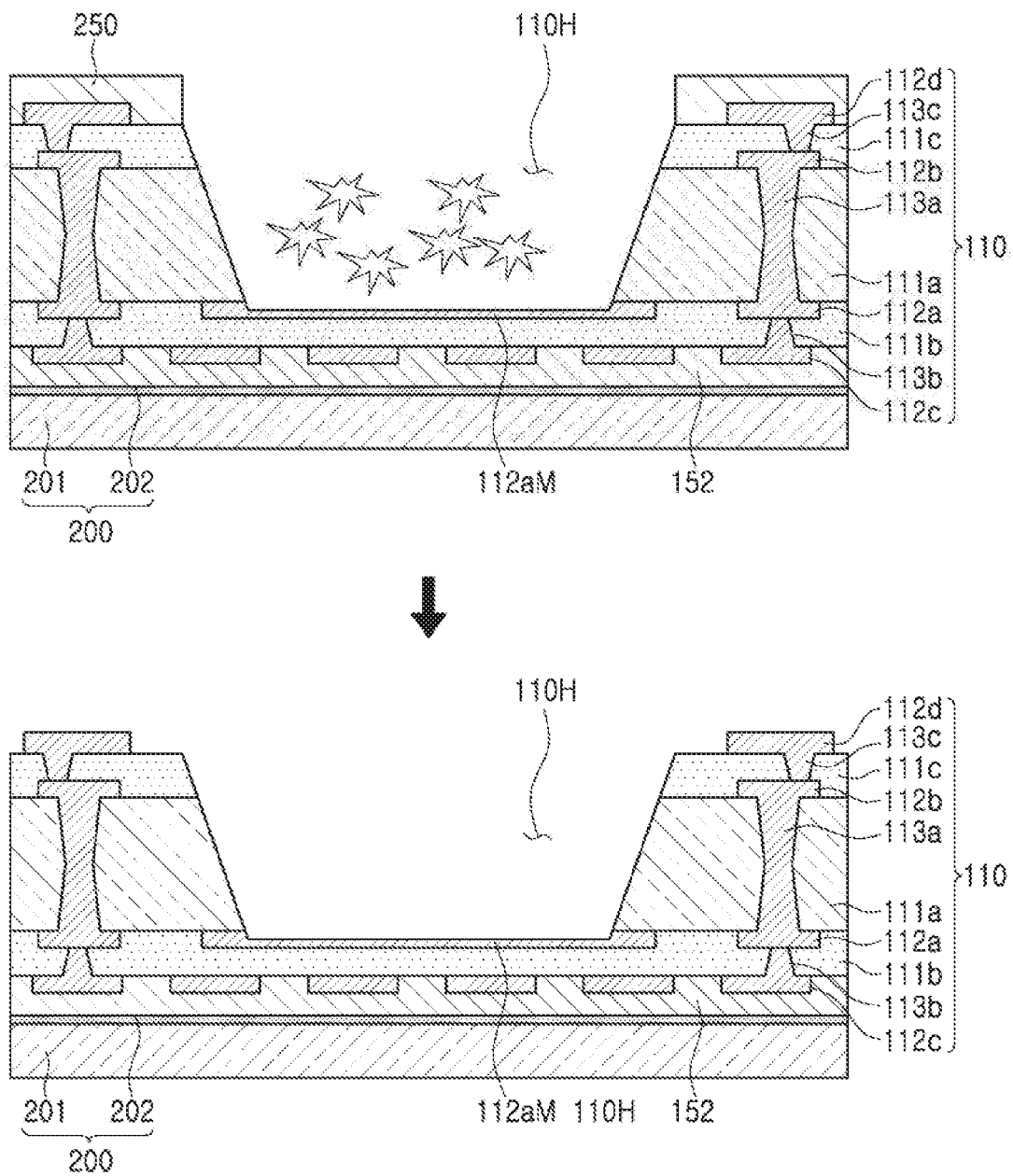

Then, referring to FIG. 12, the recess portion 110H penetrating through the core insulating layer 111a and the second build-up insulating layer 111c may be formed by a sandblast process. In this case, the stopper layer 112aM may serve as a stopper. The formed recess portion 110H may have the tapered shape by a sandblast method. After the recess portions 110H are formed, the dry film 250 may be removed.

Figure 13:
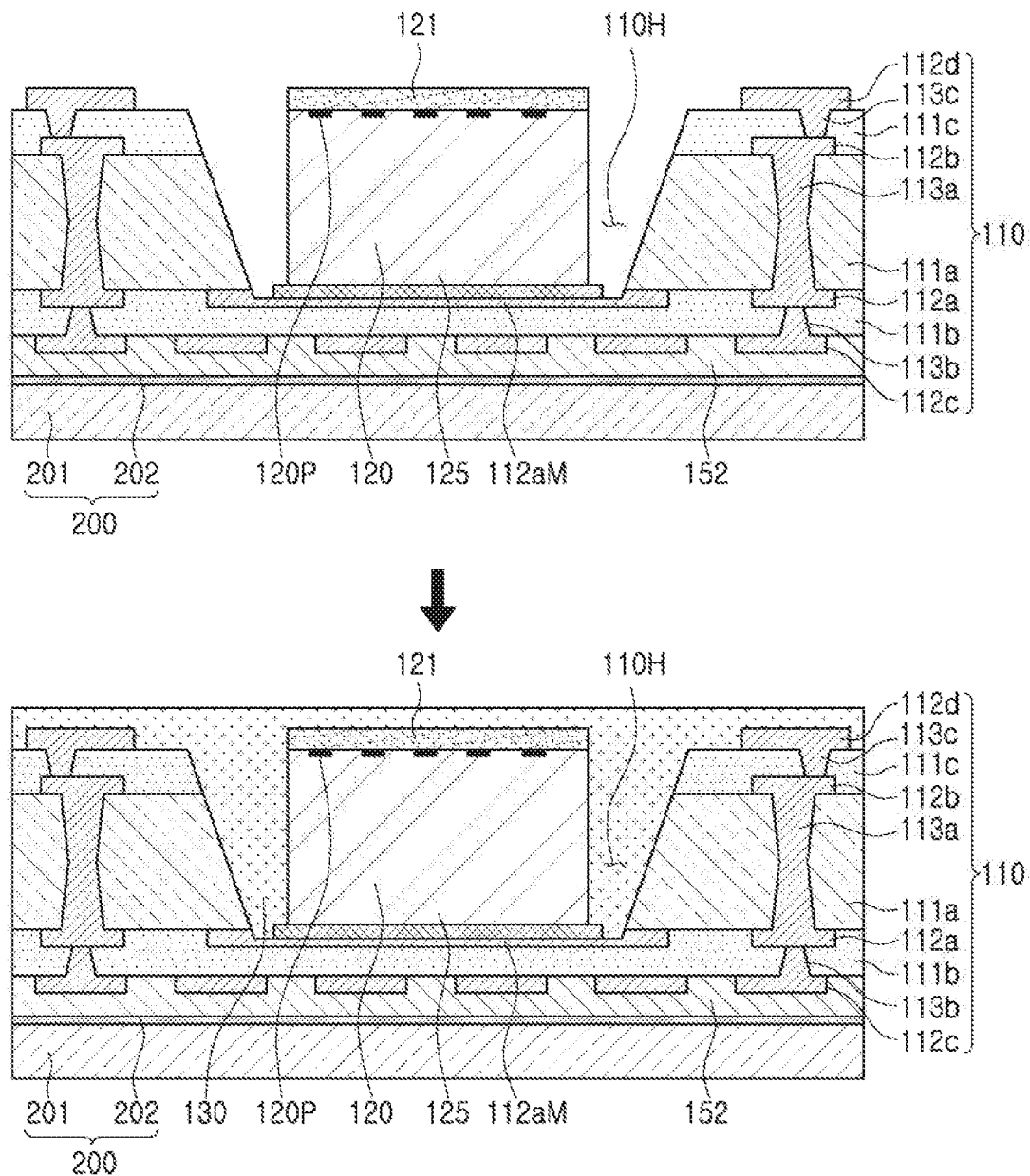

Then, referring to FIG. 13, the semiconductor chip 120 may be disposed in the recess portion 110H so that the inactive surface is attached to the stopper layer 112aM. Any known adhesive member 125 such as a DAF may be used to attach the inactive surface to the stopper layer 112aM. Meanwhile, the semiconductor chip 120 may be attached in a state in which a photosensitive insulating film is coated on the active surface to form the resin layer 121. Then, the frame 110, the semiconductor chip 120, and the resin layer 121 may be encapsulated using the encapsulant 130. The encapsulant 130 may be formed by laminating and then hardening an ABF, or the like.

Figure 14:
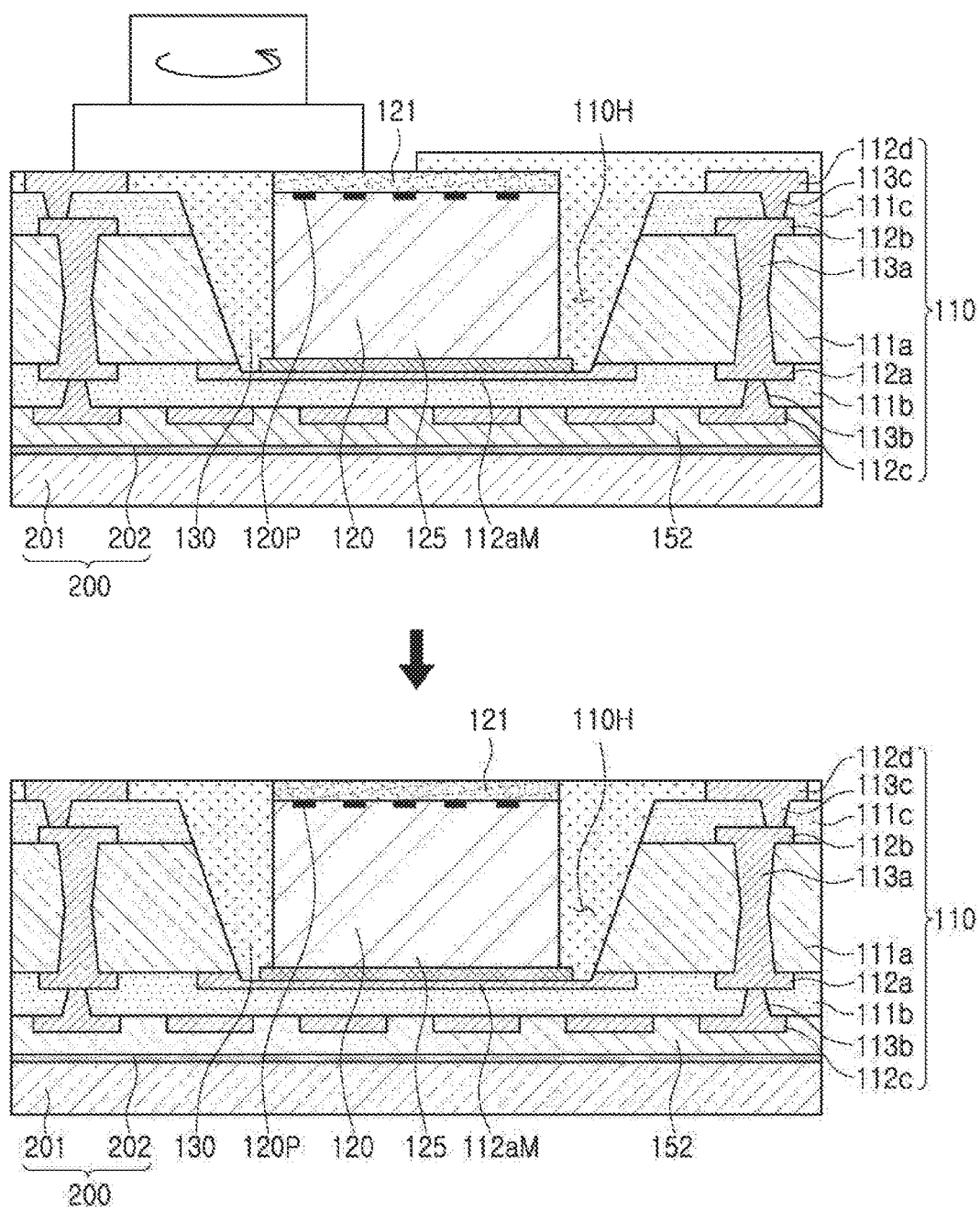

Then, referring to FIG. 14, the encapsulant 130 may be grinded so that the upper surface of the fourth wiring layer 112d and the upper surface of the resin layer 121 are exposed. The upper surface of the encapsulant 130 and the upper surface of the resin layer 121 may be disposed to be coplanar with each other by the grinding, and the upper surface of the fourth wiring layer 112d may also be disposed to be coplanar with the upper surface of the encapsulant 130 and the upper surface of the resin layer 121 by the grinding.

Figure 15:
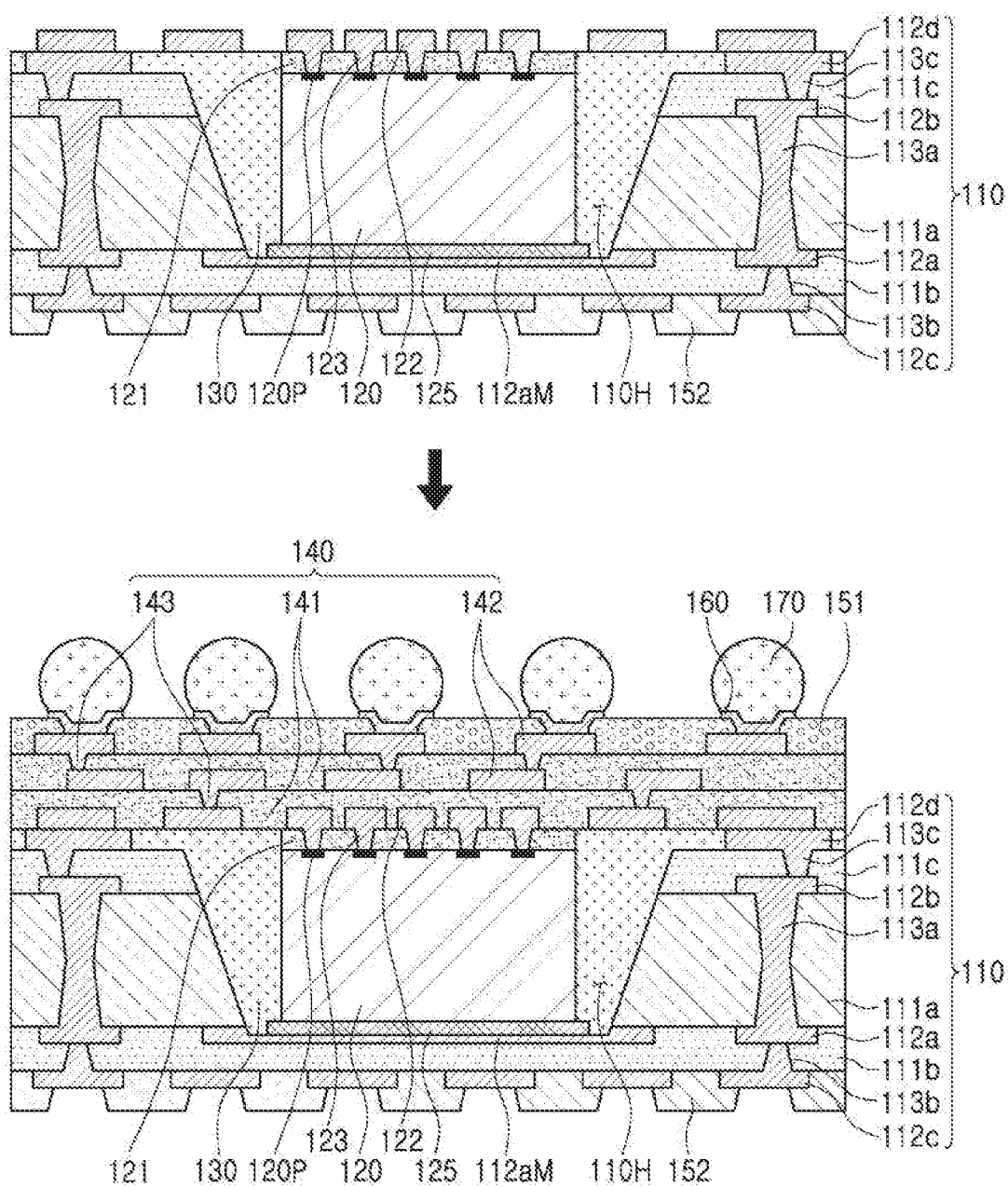

Next, referring to FIG. 15, photo via holes, or the like, may be formed in the resin layer 121 by a photolithography process, or the like, and the first redistribution layer 122 and the first redistribution vias 123 may be formed by any known plating process. Then, the dielectric layer 141 may be formed by coating a photosensitive insulating material or coating a photosensitive insulating film, photo via holes may be formed in the dielectric layer 141, the second redistribution layer 142 and the second redistribution vias 143 may be formed by plating, and the connection member 140 may be formed by repeating a series of processes, if necessary. Then, the first passivation layer 151 may be formed on the connection member 140 by laminating and then hardening an ABF, or the like, if necessary, and the carrier film 200 may be removed. In addition, the underbump metal layers 160 may be formed by any known metallization method, and the electrical connection structures 170 may be formed by a reflow process using solder balls, or the like. The fan-out semiconductor package 100A according to the exemplary embodiment may be manufactured by a series of processes.

Figure 16:
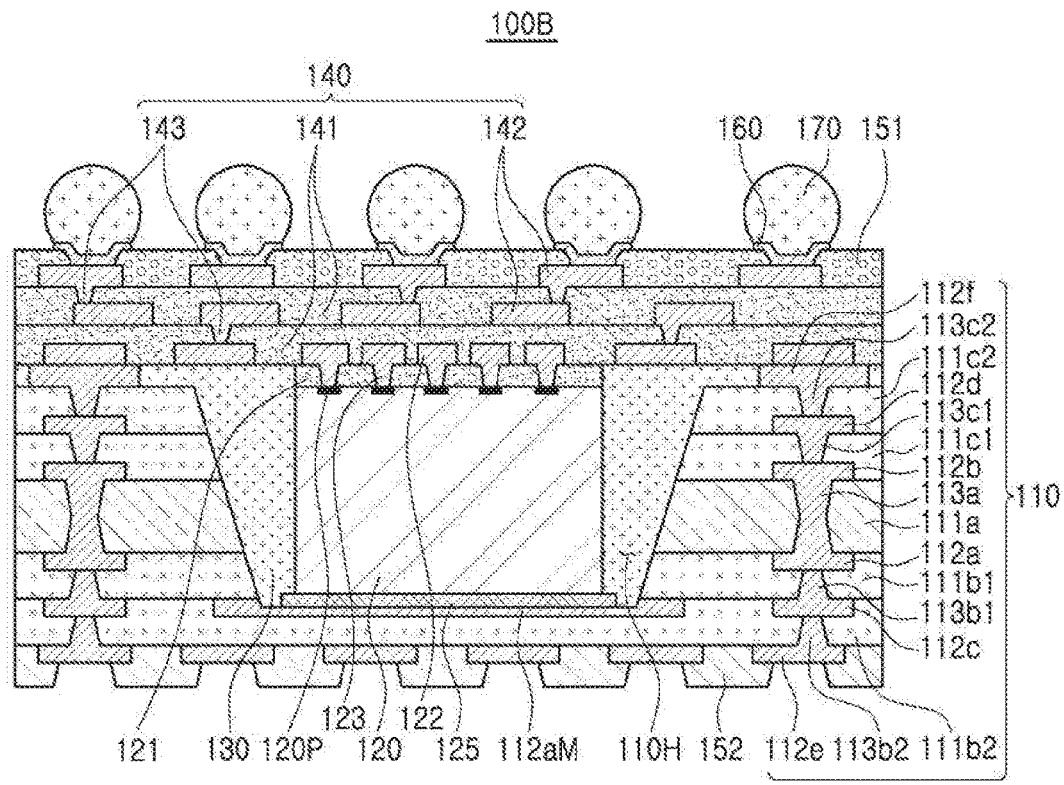
FIG. 16 is a schematic cross-sectional view illustrating another example of a fan-out semiconductor package.

FIG. 16 is a schematic cross-sectional view illustrating another example of a fan-out semiconductor package.

Referring to FIG. 16, in a fan-out semiconductor package 100B according to another exemplary embodiment, a frame 110 may include a larger number of build-up insulating layers 111b1, 111b2, 111c1, and 111c2, and may thus include a larger number of wiring layers 112a, 112b, 112c, 112d, 112e, and 112f and a larger number of connection via layers 113a, 113b1, 113b2, 113c1, and 113c2, as compared to the fan-out semiconductor package 100A according to the exemplary embodiment. When the frame 110 includes the larger number of wiring layers 112a, 112b, 112c, 112d, 112e, and 112f, various wiring designs may be possible in the frame 110, and the number of second redistribution layers 142 of a connection member 140 may thus be reduced. Therefore, the fan-out semiconductor package 100B may be thinned, and a chip-yield problem that may occur due to a process defect in a process of forming the connection member 140 may be solved. Other contents overlap those described above, and a detailed description thereof is thus omitted.

Figure 17:
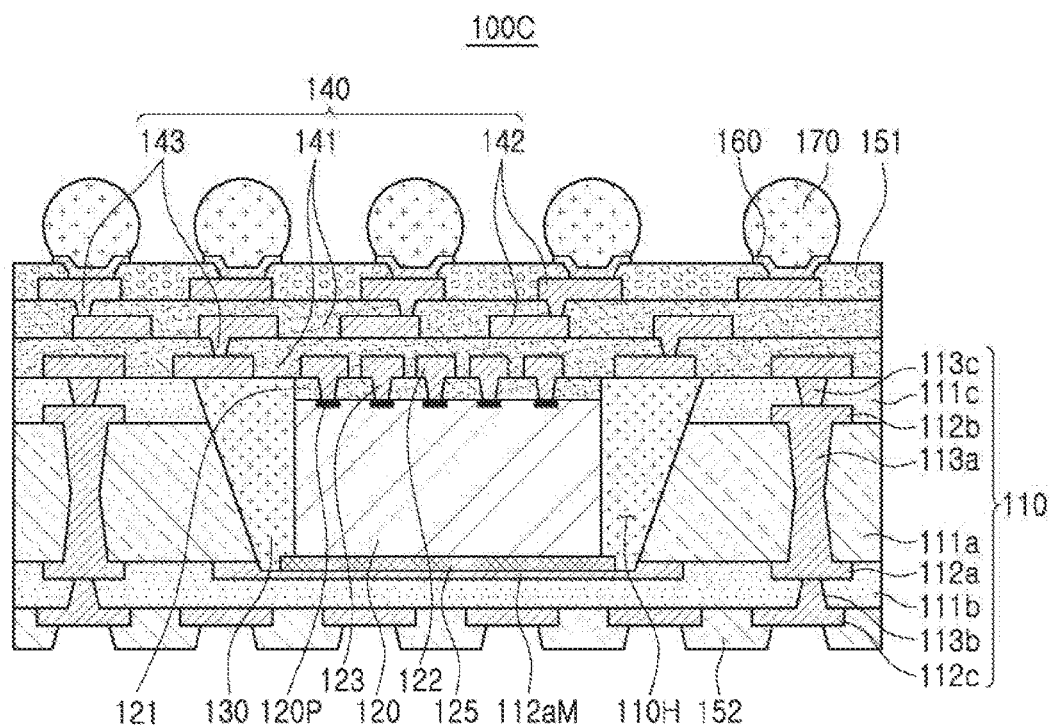
FIG. 17 is a schematic cross-sectional view illustrating another example of a fan-out semiconductor package.

FIG. 17 is a schematic cross-sectional view illustrating another example of a fan-out semiconductor package.

Referring to FIG. 17, in a fan-out semiconductor package 100C according to another exemplary embodiment, an upper surface of a third connection via layer 113c of a frame 110 may be exposed as a result of a grinding process, and be thus disposed to be coplanar with an upper surface of an encapsulant 130 and an upper surface of a resin layer 121, unlike the fan-out semiconductor package 100A according to the exemplary embodiment. That is, a fourth wiring layer 112d of the frame 110 may be removed by the grinding process. In this case, at least portions of a first redistribution layer 122 may be in physical contact with at least portions of the third connection via layer 113c. Meanwhile, since the upper surface of the third connection via layer 113c has a surface area smaller than that of an upper surface of the fourth wiring layer 112d, a problem such as a copper burr that may occur in the grinding process may be relatively suppressed. Other contents overlap those described above, and a detailed description thereof is thus omitted.

Figure 18:
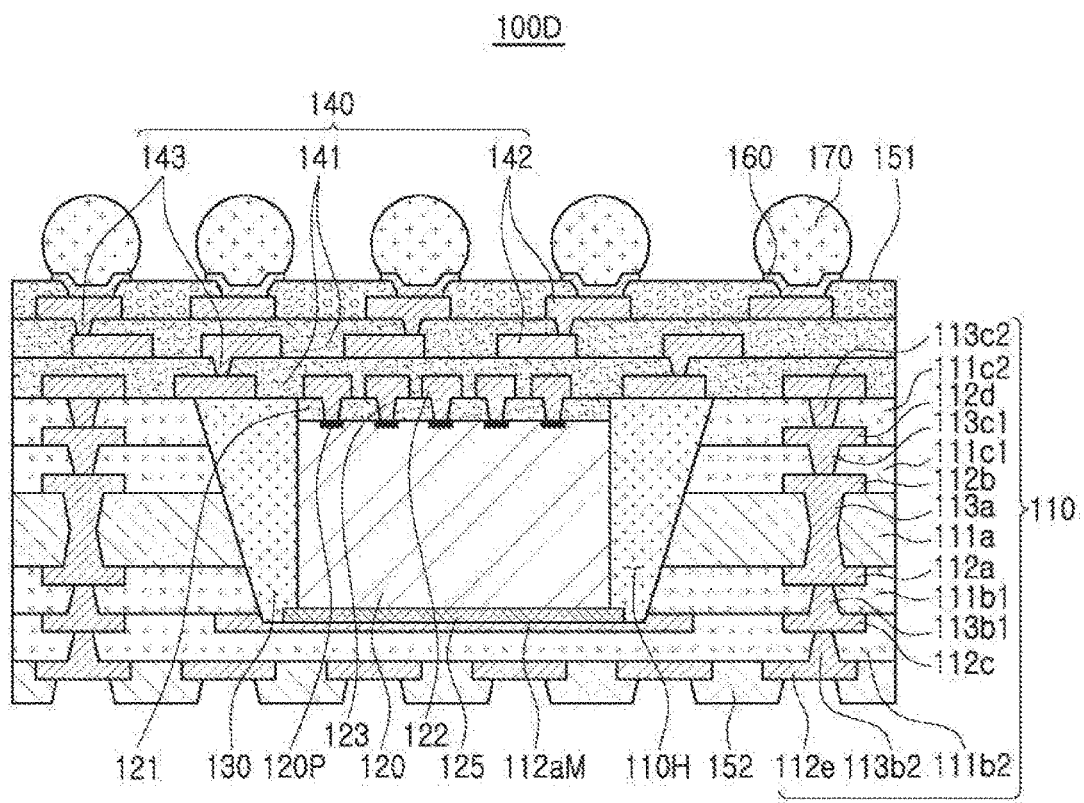
FIG. 18 is a schematic cross-sectional view illustrating another example of a fan-out semiconductor package.

FIG. 18 is a schematic cross-sectional view illustrating another example of a fan-out semiconductor package.

Referring to FIG. 18, in a fan-out semiconductor package 100D according to another exemplary embodiment, a frame 110 may include a larger number of build-up insulating layers 111b1, 111b2, 111c1, and 111c2, and may thus include a larger number of wiring layers 112a, 112b, 112c, 112d, 112e, and 112f and a larger number of connection via layers 113a, 113b1, 113b2, 113c1, and 113c2, as compared to the fan-out semiconductor package 100C according to another exemplary embodiment. Other contents overlap those described above, and a detailed description thereof is thus omitted.

As set forth above, according to an exemplary embodiment in the present disclosure, a fan-out semiconductor package in which excellent electrical characteristics may be implemented by reducing a wiring path and a cost may be reduced may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
    a frame including a plurality of insulating layers, a plurality of wiring layers disposed on the plurality of insulating layers, and a plurality of connection via layers penetrating through the plurality of insulating layers and electrically connecting the plurality of wiring layers to each other, and having a recess portion and a stopper layer disposed on a bottom surface of the recess portion;
    a semiconductor chip including a body having an active surface having connection pads disposed thereon and an inactive surface opposing the active surface and a passivation layer disposed on the active surface and having openings exposing at least portions of the connection pads, and disposed in the recess portion so that the inactive surface is connected to the stopper layer;
    a resin layer disposed on the active surface of the semiconductor chip;
    an encapsulant covering at least portions of side surfaces of each of the semiconductor chip and the resin layer and filling at least portions of the recess portion;
    a first redistribution layer disposed on the resin layer and the encapsulant;
    first redistribution vias penetrating through the resin layer to fill via holes in the resin layer exposing at least portions of the connection pads and electrically connecting the connection pads and the first redistribution layer to each other; and
    a connection member disposed on the resin layer and the encapsulant and including one or more second redistribution layers electrically connected to the first redistribution layer,
    wherein the connection pads are electrically connected to the plurality of wiring layers.

2. The fan-out semiconductor package of claim 1, wherein an upper surface of the resin layer and an upper surface of the encapsulant are coplanar with each other.

3. The fan-out semiconductor package of claim 2, wherein an upper surface of an uppermost wiring layer of the plurality of wiring layers is coplanar with the upper surface of the resin layer and the upper surface of the encapsulant, and at least portions of the first redistribution layer are in physical contact with at least portions of the uppermost wiring layer of the plurality of wiring layers.

4. The fan-out semiconductor package of claim 2, wherein an upper surface of an uppermost connection via layer of the plurality of connection via layers is coplanar with the upper surface of the resin layer and the upper surface of the encapsulant, and at least portions of the first redistribution layer are in physical contact with at least portions of the uppermost connection via layer of the plurality of connection via layers.

5. The fan-out semiconductor package of claim 1, wherein the resin layer includes a photoimagable dielectric (PID).

6. The fan-out semiconductor package of claim 1, wherein the plurality of insulating layers include a core insulating layer, one or more first build-up insulating layers disposed on a lower surface of the core insulating layer, and one or more second build-up insulating layers disposed on an upper surface of the core insulating layer, and the core insulating layer has a thickness greater than that of each of the first and second build-up insulating layers.

7. The fan-out semiconductor package of claim 6, wherein the number of the first build-up insulating layers and the number of the second build-up insulating layers are the same as each other.

8. The fan-out semiconductor package of claim 6, wherein the recess portion penetrates through at least the core insulating layer and penetrates through at least one of the one or more first and second build-up insulating layers.

9. The fan-out semiconductor package of claim 6, wherein first connection vias penetrating through the first build-up insulating layer and second connection vias penetrating through the second build-up insulating layer are tapered in opposite directions to each other.

10. The fan-out semiconductor package of claim 6, wherein the recess portion does not penetrate through at least one of the first build-up insulating layers.

11. The fan-out semiconductor package of claim 1, wherein the stopper layer is a metal layer.

12. The fan-out semiconductor package of claim 11, wherein at least one of the plurality of wiring layers includes a ground, and the metal layer is electrically connected to the ground.

13. The fan-out semiconductor package of claim 1, wherein the inactive surface of the semiconductor chip is attached to the stopper layer through an adhesive member.

14. The fan-out semiconductor package of claim 1, wherein walls of the recess portion are tapered.

15. The fan-out semiconductor package of claim 1, wherein the stopper layer has a planar area greater than that of the inactive surface of the semiconductor chip.

16. The fan-out semiconductor package of claim 1, wherein the bottom surface of the recess portion has a planar area greater than that of the inactive surface of the semiconductor chip.

17. The fan-out semiconductor package of claim 1, wherein a region of the stopper layer exposed by the recess portion has a thickness smaller than that of an edge region of the stopper layer that is not exposed by the recess portion.

18. The fan-out semiconductor package of claim 1, wherein the edge region of the stopper layer that is not exposed by the recess portion is disposed between two of the plurality of insulating layers.

19. The fan-out semiconductor package of claim 1, further comprising:

a first passivation layer disposed on the connection member and having openings exposing at least portions of an uppermost second redistribution layer of the second redistribution layers;

underbump metal layers disposed in the openings of the first passivation layer and connected to at least portions of the exposed second redistribution layer; and electrical connection structures disposed on the first passivation layer and connected to the underbump metal layers.

20. The fan-out semiconductor package of claim 1, further comprising a second passivation layer disposed beneath the frame and having openings exposing at least portions of a lowermost wiring layer of the plurality of wiring layers.

* * * * *